United States Patent
Yang et al.

(10) Patent No.: US 10,609,815 B2
(45) Date of Patent: Mar. 31, 2020

(54) COLORED ULTRATHIN HIGH FREQUENCY COVER FILM WITH HIGH HAZE AND PREPARATION METHOD THEREOF

(71) Applicant: Kunshan Aplus Tec. Corporation, Kunshan (CN)

(72) Inventors: Lichih Yang, Kunshan (CN); Weichih Lee, Kunshan (CN); Chienhui Lee, Kunshan (CN); Chihming Lin, Kunshan (CN)

(73) Assignee: KUNSHAN APLUS TEC.CORPORATION, Kunshan (CN)

( * ) Notice: Subject to any disclaimer, the term of this patent is extended or adjusted under 35 U.S.C. 154(b) by 231 days.

(21) Appl. No.: 15/796,728

(22) Filed: Oct. 27, 2017

(65) Prior Publication Data
US 2018/0343738 A1 Nov. 29, 2018

(30) Foreign Application Priority Data
May 23, 2017 (CN) .......................... 2017 1 0365861

(51) Int. Cl.
*H05K 1/02* (2006.01)
*B32B 37/12* (2006.01)
(Continued)

(52) U.S. Cl.
CPC ............. *H05K 1/0274* (2013.01); *B32B 7/06* (2013.01); *B32B 7/12* (2013.01); *B32B 37/12* (2013.01); *B32B 2255/00* (2013.01); *B32B 2307/3065* (2013.01); *B32B 2307/4023* (2013.01); *B32B 2307/536* (2013.01); *B32B 2307/538* (2013.01);
(Continued)

(58) Field of Classification Search
CPC .... H05K 1/0274; H05K 1/0393; H05K 3/281; H05K 2201/0195; B32B 7/06; B32B 7/12; B32B 37/12; B32B 2255/00; B32B 2307/3065; B32B 2307/4023;
(Continued)

(56) References Cited

U.S. PATENT DOCUMENTS

2015/0030845 A1* 1/2015 Carney ................ C08K 5/3417
428/329

FOREIGN PATENT DOCUMENTS

JP      2004214288 A  *  7/2004

OTHER PUBLICATIONS

Translation to English for JP 2004-214288 on espacenet. accessed Oct. 31, 2019. (Year: 2004).*

* cited by examiner

*Primary Examiner* — Nancy R Johnson
(74) *Attorney, Agent, or Firm* — Bayramoglu Law Offices LLC

(57) ABSTRACT

The invention discloses a high-haze colored ultra-thin high-frequency cover film and a preparation method thereof, including a colored ink layer and a high-frequency adhesive layer. The colored ink layer is located above the high-frequency adhesive layer, and the colored ink layer is provided with at least one layer. A hardness of the colored ink layer is HB-5H. A glossiness of the colored ink layer ranges from 0 to 60% (60°). A roughness of the colored ink layer is 50-1000 nm. A thickness of the colored ink layer is 1-10 microns, and a thickness of the high-frequency adhesive layer is 3-25 microns. The high-haze colored ultra-thin high-frequency cover film provided by the present invention includes a colored ink layer and a high-frequency adhesive layer, and the upper portion and the lower portion are respectively attached to the release film or the release layer of the release paper.

10 Claims, 1 Drawing Sheet

(51) Int. Cl.
  *B32B 7/06* (2019.01)
  *B32B 7/12* (2006.01)
  *H05K 1/03* (2006.01)
(52) U.S. Cl.
  CPC ...... *B32B 2309/105* (2013.01); *H05K 1/0393* (2013.01)
(58) Field of Classification Search
  CPC ........ B32B 2307/536; B32B 2307/538; B32B 2309/105
  See application file for complete search history.

COLORED ULTRATHIN HIGH FREQUENCY COVER FILM WITH HIGH HAZE AND PREPARATION METHOD THEREOF

CROSS REFERENCE TO RELATED APPLICATIONS

This application is based upon and claims priority to Chinese Application No. CN201710365861.3, filed on May 23, 2017, the entire content of which is incorporated herein by reference.

TECHNICAL FIELD

The present invention relates to the field of a cover film for an FPC (flexible circuit board) and a preparation technology thereof, in particular to a high-haze colored ultrathin high-frequency cover film and a preparation method thereof.

BACKGROUND OF THE INVENTION

Due to the fact that electronic systems are developing towards lightness and shortness, high heat resistance, multi-functionality, high density, high reliability and low cost, powerful and high-speed signal transmission is thus a needed function. In the high-frequency field, the wireless infrastructure needs to provide enough low insertion loss, lower dielectric constant and less loss, to effectively improve the energy utilization rate. With the upcoming 5G age and application requirements of USB3.1, radio frequency products need to provide a wider bandwidth and needs to be downwards compatible with the 3G service and the 4G service. The common material of the cover film on the current market is the black polyimide film. As to the thinning design, the bottleneck of the black polyimide film is that it is extremely difficult and poorly operational to create a black polyimide film having the thickness less than 5 microns. Additionally, the adhesive like epoxy resin is poor in ion purity, poor in electrical property and high in cost. Hence, the above factors make the cover film difficult to adapt to the trend of current ultra-fine circuits and high-frequency high-speed transmission. As to the other ink type colored high-frequency cover film, a yellow ultrathin polyimide film coated with colored ink and having the thickness of 5-7.5 microns is used. This method also has the problems of being high in cost and large in thickness.

Further, the other manufacturing method currently used in the art is coating a yellow ultrathin polyimide film having the thickness of 5-7.5 microns with a black adhesive or ink, and attaching a bearing film to the black adhesive or the ink. The film belongs to a non-absorbent (bright) cover film, which causes high-glossiness (greater than 50 GU), poor processing operability, and high cost.

In the industrial design, to meet the requirements of the unexposed circuit design, beauty, visual protection and the like, a film with a low glossiness (low haze and high extinction ratio) is in demand. Black polyimide manufacturers in the market always add the powder to form surface scattering, so as to reduce the glossiness. For example, the Taiwanese patent application TW201132714A1 discloses a low-gloss black polyimide film doped with the ceramic powder. The Taiwanese patent application TW1481646B discloses a low-gloss polyimide film doped with polyimide powder. The South Korean patent application 10-2012-0036253 discloses a black polyimide film doped with carbon black. However, the method is not easy to be applied on an ultrathin polyimide film having the thickness of 5-7.5 microns.

In order to overcome the above defects, the colored polyimide cover is replaced by a high-frequency colored ultra-thin cover film, which is composed of a colored ink layer and a high-frequency adhesive. The advantages of the color ink layer, i.e., high color ink layer extinction, high flame retardancy, high hardness and the like, can be achieved by changing the resin, adding doping powder, changing the content of the powder, and designing a particle diameter.

SUMMARY OF THE INVENTION

In view of current fine-line circuits, in order to meet the development trend of the very low dielectric constant and loss, excellent ion mobility, extremely high ion purity, good adhesion force, low counter-force, high flexibility, process ability at low temperature, high heat dissipation performance, high flame retardancy, high extinction, high hardness, low cost and the like, and the requirements of functionally powerful and high-speed signal transmission, the invention provides a high-haze colored ultra-thin high-frequency cover film. The cover film includes a colored ink layer and a high-frequency adhesive layer, and the upper portion and the lower portion are respectively attached to the release film or the release layer of the release paper. The cover film has extremely low dielectric constant and loss, and has extremely high ion purity, ultra-thin laminated thickness, high heat dissipation performance, high flame retardancy and high extinction, and is particularly suitable for being used in high-frequency fine-line circuits. Compared with traditional cover films, the cover film has higher reliability and operability, and the glossiness value of the surface can be adjusted, so that the traditional cover membrane material can be replaced.

In order to solve the above technical problems, the technical solutions adopted by the invention are as follows: A high-haze colored ultra-thin high-frequency cover film is provided, including: a colored ink layer and a high-frequency adhesive layer, the colored ink layer is located above the high-frequency adhesive layer, and the colored ink layer is provided with at least one layer.

A hardness of the colored ink layer is HB-5H.

A glossiness of the colored ink layer ranges from 0 to 60% (60°).

A roughness of the colored ink layer is 50-1000 nm.

A thickness of the colored ink layer is 1-10 microns, and a thickness of the high-frequency adhesive layer is 3-25 microns.

Preferably, the hardness of the colored ink layer is 2H-5H.

Preferably, the thickness of the colored ink layer is 1-3 microns, and the thickness of the high-frequency adhesive layer is 3-10 microns.

Further, the colored ink layer is provided with two layers, and the two layers are respectively a first colored ink layer and a second colored ink layer. The first colored ink layer is located on an upper surface of the second colored ink layer, the second colored ink layer is located on an upper surface of the high-frequency adhesive layer.

A thickness of the first colored ink layer and a thickness of the second colored ink layer are both 2-3 microns.

Further, the colored ultra-thin high-frequency cover film further includes an auxiliary adhesive layer, the auxiliary adhesive layer is located between the colored ink layer and the high-frequency adhesive layer, and a thickness of the auxiliary adhesive layer is 3-25 microns.

Further, the colored ink layer is an ink layer containing extinction powder, and a particle diameter of the extinction powder is 2-12 microns (D90).

Further, the extinction powder in the colored ink layer is at least one of inorganic powder, organic powder, polyimide system and a compound with flame retardancy. The inorganic powder is at least one of calcium sulfate, carbon black, silicon dioxide, titanium dioxide, zinc sulfide, zirconium oxide, calcium carbonate, silicon carbide, boron nitride, aluminum oxide, aluminum hydroxide, talcum powder, aluminum nitride, glass powder, quartz powder, emery and clay. The compound with the flame retardancy is a flame-retardant compound containing at least one of halogen, phosphorus system, nitrogen and boron system.

Further, the cover film further includes a release layer, and the release layer includes an upper release layer and a lower release layer. The upper release layer is an extinction release film layer, and a surface of the extinction release film layer in contact with the colored ink layer is a rough surface having Rz value of 0.2-10 microns.

Further, the high-frequency adhesive layer is a layer having Dk value of 2.4-3.0 (10 GHz), DF value of 0.002-0.006 (10 GHz), a water absorption rate of 0.03-0.2%, an inter-line insulation resistance larger than $10^{11} \Omega$, a surface resistance larger than $10^{12} \Omega$, and a volume resistance larger than $10^{13}$ $\Omega \cdot cm$.

Further, the high-frequency adhesive layer includes fused silicon dioxide, polytetrafluoroethylene, fluorine-based resin, a phosphorus-based flame retardant, and polyimide-based resin. A sum of proportions of the fused silicon dioxide, the polytetrafluoroethylene, the fluorine-based resin and the phosphorus-based flame retardant is 8-50% (by weight) of a total solid content, and a proportion of a polyimide-based resin content is 40%-90% (by weight).

Further, the colored ink layer includes an inorganic pigment or an organic pigment.

Wherein, the inorganic pigment is at least one of cadmium red, cadmium lemon yellow, orange cadmium yellow, titanium dioxide, carbon black, black iron oxide and black staggered inorganic pigment, and a sum of a proportion of the inorganic pigment is 5-70% (by weight) of a total solid content of the colored ink layer.

The organic pigment is at least one of aniline black, perylene black, anthraquinone black, benzidine yellow pigment, phthalocyanine blue and phthalocyanine green, and a sum of a proportion of the organic pigment is 5-70% (by weight) of the total solid content of the colored ink layer.

Further, if the colored ink layer is a single layer, the sum of the thickness of the colored ink layer and the high-frequency adhesive layer is 4-35 microns.

Further, the upper release layer and the lower release layer are both a release layer composed of at least one of polypropylene, biaxial-oriented polypropylene and polyethylene glycol terephthalate.

Further, the resin material in the colored ink layer is at least one of epoxy resin, acrylic-based resin, urethane-based resin, silicone rubber-based resin, poly-p-xylene-based resin, bismaleimide-based resin, polyimide-based resin and polyamideimide.

Preferably, when the high haze requirement is met, the glossiness of the colored ink layer is 5-25 GU (60°). When an extremely high haze requirement is met, the glossiness of the colored ink layer is 0-5 GU (60°).

Further, the extinction powder of the colored ink layer is 2-50% of the total solid content.

Preferably, in the extinction powder, the sum of the proportions of the silicon dioxide, carbon black, talcum powder, calcium carbonate, glass powder and the quartz powder is 10-50% (by weight) of the total solid content, or the proportion of the phosphorus-based compound is 2-40% (by weight) of the total solid content.

Preferably, considering the cost, when a higher hardness is required, the extinction powder in the colored ink layer is preferably at least one of titanium dioxide and silicon dioxide. When the high flame resistance is considered, the extinction powder is preferably at least one of aluminum hydroxide, aluminum oxide, calcium carbonate, a phosphorus-containing compound with flame retardancy, a halogen-containing compound with flame retardancy, a nitrogen-containing compound with flame retardancy and a boron-containing compound with flame retardancy.

Further, the resin material of the high-frequency adhesive layer is a fluorine-based resin, epoxy resin, acrylic resin, amino acid ester resin, silicone rubber system resin, poly-p-xylene-based resin, bismaleimide resin, polyimide-based resin and polyamideimide.

Further, the resin material in the auxiliary adhesive layer is at least one of epoxy resin, acrylic-based resin, urethane-based resin, silicone rubber-based resin, poly-p-xylene-based resin, bismaleimide-based resin, polyamideimide and polyimide-based resin.

The invention further provides a method of preparing the high-haze colored ultra-thin high-frequency cover film, and the method is one of following methods:

A first method is performed according to following steps:

step 1, coating a colored printing ink raw material on a lower surface of an upper release layer, and curing at a low temperature of 50-180° C. to form a colored ink layer;

step 2, forming a high-frequency adhesive layer on a lower surface of the colored ink layer by a coating method or a transfer printing method;

step 3, attaching a lower release layer to a lower surface of the high-frequency adhesive layer to obtain a finished product.

A second method is performed according to following steps:

step 1, coating a colored printing ink raw material on a lower surface of an upper release layer, and curing at a low temperature of 50-180° C. to form a first colored ink layer and a second colored ink layer;

step 2, forming a high-frequency adhesive layer on a lower surface of the second colored ink layer by a coating method or a transfer printing method;

step 3, attaching a lower release layer to a lower surface of the high-frequency adhesive layer to obtain a finished product.

A third method is performed according to following steps:

step 1, coating a colored printing ink raw material on a lower surface of the upper release layer, and curing at a low temperature of 50-180° C. to form a colored ink layer;

step 2, coating an auxiliary adhesive layer on a surface of the colored ink layer, step 3, forming a high-frequency adhesive layer on a lower surface of the auxiliary adhesive layer by a coating method or a transfer printing method; step 4, attaching a lower release layer to a lower surface of the high-frequency adhesive layer to obtain a finished product.

The invention has the following beneficial effects, and the invention has at least the following advantages.

1. The surface glossiness of the colored ink layer is 0-60 GU (60°), preferably less than 25%, and the hardness is HB-5H, preferably 2H-5H. Therefore, the invention not only has the haze surface characteristic, but also has the high hardness, which can prevent the surface from scratches and corrosion by chemical reagents in the downstream process. Further, the invention has a good weathering performance.

2. If the high hardness, the mechanical strength and the inter-layer adhesive force are required, an auxiliary adhesive layer can be added between the colored ink layer and the high-frequency adhesive layer. The thickness of the auxiliary adhesive layer is 3-25 microns, the adhesive force between the colored ink layer and the high-frequency adhesive layer can be effectively increased, and the overall hardness and mechanical strength of the product can be improved.

3. According to the invention, a double-layer ink can be coated. Namely, the colored ink layer includes a first colored ink layer and a second colored ink layer, and the problem of micropores existing in the coating process can be solved, and the yield of the process is improved.

4. The colored ink layer of the present invention contains extinction powder, and the surface extinction degree of the coating film is adjusted by controlling the particle diameter of the powder. The particle diameter is controlled to be 2-12 microns. The smaller particle diameter the extinction powder has, the higher the surface gloss (glossiness) of the extinction powder, i.e., the brighter the surface form. The particle diameter, the variety, the content and the like of the extinction powder are adjusted to obtain the product with required glossiness, burn resistance, hardness or cost and the like). Further, the added extinction powder can further improve the hardness of the colored ink layer, so that the product has higher mechanical property, electrical performance, operability and the like.

5. An extinction release film layer is provided on the surface of the colored ink layer, having the surface Rz (roughness) of 0.2-10 microns. The colored ink layer and the release layer of the cover film are easier to separate in this mode, so that the operability of the downstream terminal is greatly improved. Meanwhile, the extinction release film layer enables the cover film to be subjected to rapid compression molding. After the release film layer is torn off, the surface mode of the colored ink layer is facilitated to be in the extinction mode.

6. The formula of the high-frequency adhesive layer contains polyimide resin, fused silicon dioxide and polytetrafluoroethylene, a fluorine-based resin and a phosphorus-based flame retardant, so that the low water absorption rate is achieved, the performance is stable after water absorption, and the electrical performance is good. Further, the signal transmission insertion loss can be reduced, and the Dk/Df value is extremely low and is stable in a high-temperature humid environment. Hence, the invention is suitable for low-temperature (less than 180° C.) high-speed pressing, and has high processing performance and fewer requirements for manufacturing equipment, and the production cost is further reduced.

7. The sum of the thickness of the colored ink layer and the thickness of the high-frequency adhesive layer can be as small as 4-7 microns, to meet the design requirements of an existing FPC fine line circuits.

8. The present invention has a relatively low rebound force and is suitable for the downstream high-density assembly process.

The above description of the present invention is only a summary of the technical solutions of the present invention. In order to make the technical solutions of the present invention to be understood more clearly, and implemented according to the content of description, the preferred embodiments of the present invention are described in more detail below, with reference to the accompanying drawings.

Figure 1:
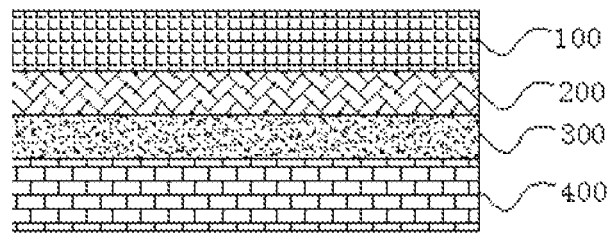
FIG. 1 is a schematic structural diagram (a layer of colored ink layer) of the invention.

The parts in the drawings are marked as follows:
100—upper release layer; 200—colored ink layer; 201—first colored ink layer; 202—second colored ink layer; 300—high-frequency adhesive layer; 400—lower release layer; 500—auxiliary adhesive layer.

DETAILED DESCRIPTION OF THE EMBODIMENTS

The embodiments of the present invention are described below through specific examples. A person skilled in the art can easily understand the advantages and functions of the present invention from the contents disclosed in this specification. The invention can be implemented in other different ways, i.e., different modifications and changes can be made without departing from the scope of the invention.

Embodiment 1

A high-haze colored ultra-thin high-frequency cover film is disclosed. As shown in FIG. 1, the cover film includes a colored ink layer 200 and a high-frequency adhesive layer 300. The colored ink layer 200 is located above the high-frequency adhesive layer 300. The colored ink layer is provided with at least one layer.

The hardness of the colored ink layer is HB-5H.

The glossiness of the colored ink layer ranges from 0 to 60% (60°).

The roughness of the colored ink layer is 50-1000 nm.

The thickness of the colored ink layer is 1-10 microns, and the thickness of the high-frequency adhesive layer is 3-25 microns.

In this embodiment, the colored ink layer is a single layer, and the sum of the thickness of the colored ink layer 200 and the high-frequency adhesive layer 300 is 4-35 microns.

Preferably, the hardness of the colored ink layer 200 is 2H-5H.

Preferably, the thickness of the colored ink layer 200 is 1-3 microns, and the thickness of the high-frequency adhesive layer 300 is 3-10 microns.

The colored ink layer 200 is an ink layer containing extinction powder, and the particle diameter of the extinction powder is 2-12 microns (D90).

The extinction powder in the colored ink layer is at least one of inorganic powder, organic powder, polyimide system and a compound with flame retardancy. The inorganic powder is at least one of calcium sulfate, carbon black, silicon dioxide, titanium dioxide, zinc sulfide, zirconium oxide, calcium carbonate, silicon carbide, boron nitride, aluminum oxide, aluminum hydroxide, talcum powder, aluminum nitride, glass powder, quartz powder, emery, and clay. The compound with the flame retardancy is a flame-retardant compound containing at least one of halogen, phosphorus system, nitrogen, and boron system.

The invention further includes a release layer. The release layer includes an upper release layer 100 and a lower release layer 400. The upper release layer 100 is an extinction release film layer. The surface of the extinction release film layer in contact with the colored ink layer 200 is a rough surface having Rz value of 0.2-10 microns.

The high-frequency adhesive layer 300 is a layer having Dk value of 2.4-3.0 (10 GHz), DF value of 0.002-0.006 (10 GHz), a water absorption rate of 0.03-0.2%, inter-line insulation resistance larger than 10Ω, surface resistance larger than $10^{12}$Ω, and volume resistance larger than $10^{13}$ Ω·cm.

The high-frequency adhesive layer 300 includes fused silicon dioxide, polytetrafluoroethylene, fluorine-based resin, a phosphorus-based flame retardant, polyamideimide and polyimide-based resin. The sum of the proportions of the fused silicon dioxide, the polytetrafluoroethylene, the fluorine-based resin and the phosphorus-based flame retardant is 8-50% (by weight) of the total solid content. The proportion of the polyimide-based resin content is 40%-90% (by weight).

The colored ink layer 200 includes inorganic pigment or organic pigment;

Wherein, the inorganic pigment is at least one of cadmium red, cadmium lemon yellow, orange cadmium yellow, titanium dioxide, carbon black, black iron oxide and black staggered inorganic pigment. The sum of the proportions of the inorganic pigments is 5-70% (by weight) of the total solid content of the colored ink layer.

The organic pigment is at least one of aniline black, perylene black and anthraquinone black, benzidine yellow pigment, phthalocyanine blue and phthalocyanine green. The sum of the proportions of the organic pigments is 5-70% (by weight) of the total solid content of the colored ink layer.

The upper release layer 100 and the lower release layer 400 are both a release layer composed of at least one of polypropylene, biaxial-oriented polypropylene, and polyethylene glycol terephthalate.

The resin material in the colored ink layer is at least one of epoxy resin, acrylic-based resin, urethane-based resin, silicone rubber-based resin, poly-p-xylene-based resin, bismaleimide-based resin, polyimide-based resin, and polyamideimide.

Preferably, when the low haze requirement is met, the glossiness of the colored ink layer is 5-25 GU (60°). When an extremely low haze requirement is met, the glossiness of the colored ink layer is 0-5 GU (60°).

The extinction powder of the colored ink layer 200 is 2-50% of the total solid content.

Preferably, in the extinction powder, the sum of the proportions of the silicon dioxide, carbon black, talcum powder, calcium carbonate, glass powder and the quartz powder is 10-50% (by weight) of the total solid content, or the proportion of the phosphorus-based compound is 2-40% (by weight) of the total solid content.

Considering the cost, when a higher hardness is required, the extinction powder in the colored ink layer is preferably at least one of titanium dioxide and silicon dioxide. When the high flame resistance is considered, the extinction powder is preferably at least one of aluminum hydroxide, aluminum oxide, calcium carbonate, a phosphorus-containing compound with flame retardancy, a halogen-containing compound with flame retardancy, a nitrogen-containing compound with flame retardancy and a boron-containing compound with flame retardancy.

The resin material of the high-frequency adhesive layer 300 is a fluorine-based resin, epoxy resin, acrylic resin, amino acid ester resin, silicone rubber system resin, poly-p-xylene-based resin, bismaleimide resin, polyamideimide and polyimide-based resin.

Embodiment 2

Figure 2:
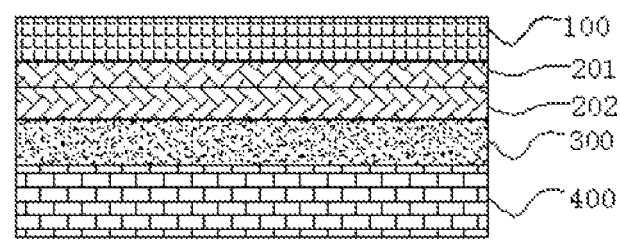
FIG. 2 is another schematic structural diagram (two layers of colored ink layers) of the invention.

As shown in FIG. 2, this embodiment is almost the same as Embodiment 1, and the differences are as below: the colored ink layer is provided with two layers, and the two layers are respectively a first colored ink layer 201 and a second colored ink layer 202. The first colored ink layer 201 is located on the upper surface of the second colored ink layer 202, the second colored ink layer 202 is located on the upper surface of the high-frequency adhesive layer 300.

The thickness of the first colored ink layer 201 and the thickness of the second colored ink layer 202 are both 2-3 microns.

The resin material in the auxiliary adhesive layer is at least one of epoxy resin, acrylic-based resin, urethane-based resin, silicone rubber-based resin, poly-p-xylene-based resin, bismaleimide-based resin, polyamideimide and polyimide-based resin.

Embodiment 3

Figure 3:
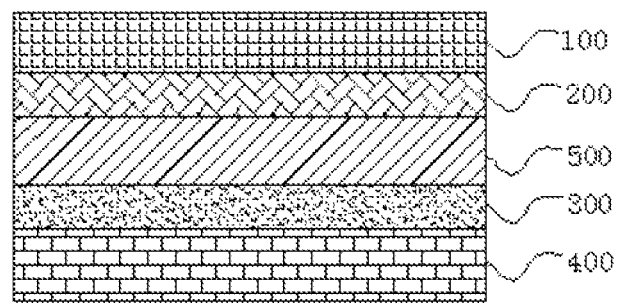
FIG. 3 is another schematic structural diagram (containing an auxiliary adhesive layer) of the present invention.

As shown in FIG. 3, this embodiment is almost the same as embodiment 1, and the differences are as below: the colored ultra-thin high-frequency cover film further includes an auxiliary adhesive layer 500. The auxiliary adhesive layer 500 is located between the colored ink layer 200 and the high-frequency adhesive layer 300, and the thickness of the auxiliary adhesive layer 500 is 3-25 microns.

The invention further provides a preparation method of the high-haze colored ultra-thin high-frequency cover film, wherein the preparation method is one of the following methods:

The first method (suitable for Embodiment 1) is as follows: the method is performed according to the following steps:

Step 1, coating a colored printing ink raw material on the lower surface of the upper release layer, and curing at a low temperature of 50-180° C. to form a colored ink layer;

Step 2, forming a high-frequency adhesive layer on the lower surface of the colored ink layer by a coating method or a transfer printing method;

Step 3, attaching a lower release layer to the lower surface of the high-frequency adhesive layer to obtain a finished product.

The second method (suitable for Embodiment 2) is as follows: the method is performed according to the following steps:

Step 1, coating a colored printing ink raw material on the lower surface of the upper release layer, and curing at a low temperature of 50-180° C. to form a first colored ink layer and a second colored ink layer;

Step 2, forming a high-frequency adhesive layer on the lower surface of the second colored ink layer by a coating method or a transfer printing method;

Step 3, attaching a lower release layer to the lower surface of the high-frequency adhesive layer to obtain a finished product.

The third method (suitable for Embodiment 3) is as follows: the method is performed according to the following steps:

Step 1, coating a colored printing ink raw material on the lower surface of the upper release layer, and curing at a low temperature of 50-180° C. to form a colored ink layer;

Step 2, coating an auxiliary adhesive layer on the surface of the colored ink layer;

Step 3, forming a high-frequency adhesive layer on the lower surface of the auxiliary adhesive layer by a coating method or a transfer printing method;

Step 4, attaching a lower release layer to the lower surface of the high-frequency adhesive layer to obtain a finished product.

Table 1 shows the specific overlapping structure and the basic performance indexes of the high-frequency adhesive layer and the colored ink layer of Embodiments A1-A12. The result is as follows.

TABLE 1

| | Thickness of colored ink layer | | | | | heat | heat | | | | |
|---|---|---|---|---|---|---|---|---|---|---|---|
| | 1st colored ink layer μm | 2nd colored ink layer μm | auxiliary adhesive layer μm | high-freq. adhesive layer μm | total thickness μm | conduction coefficient K W/mk | conduction efficiency R °C./W | Break-down voltage KV | dielectric constant Dk 10 GHz | dielectric loss Df 10 GHz | inter-line insulation impedance Ω/KV |
| Embodiment A1 | 2 | 3 | — | 3 | 8 | 0.436 | 0.021 | 0.8 | 2.78 | 0.005 | >10$^{11}$ |
| Embodiment A2 | 3 | 2 | — | 5 | 10 | 0.392 | 0.032 | 1 | 2.72 | 0.005 | >10$^{11}$ |
| Embodiment A3 | 2 | 2 | — | 10 | 14 | 0.411 | 0.057 | 1.8 | 2.61 | 0.004 | >10$^{11}$ |
| Embodiment A4 | 5 | | — | 20 | 25 | 0.358 | 0.108 | 2.5 | 2.73 | 0.003 | >10$^{11}$ |
| Embodiment A5 | 1 | | — | 15 | 16 | 0.412 | 0.062 | 1.7 | 2.65 | 0.003 | >10$^{11}$ |
| Embodiment A6 | 3 | | — | 25 | 28 | 0.336 | 0.073 | 1.6 | 2.63 | 0.003 | >10$^{11}$ |
| Embodiment A7 | 4 | | 3 | 18 | 25 | 0.456 | 0.047 | 1.5 | 2.78 | 0.005 | >10$^{11}$ |
| Embodiment A8 | 7 | | 5 | 12 | 24 | 0.398 | 0.052 | 1.9 | 2.76 | 0.005 | >10$^{11}$ |
| Embodiment A9 | 8 | | 10 | 16 | 34 | 0.375 | 0.027 | 2.3 | 2.72 | 0.006 | >10$^{11}$ |
| Embodiment A10 | 10 | | 15 | 3 | 28 | 0.356 | 0.035 | 2.3 | 2.83 | 0.006 | >10$^{11}$ |
| Embodiment A11 | 8 | | 20 | 10 | 38 | 0.445 | 0.029 | 2.2 | 2.85 | 0.006 | >10$^{11}$ |
| Embodiment A12 | 6 | | 25 | 15 | 46 | 0.472 | 0.043 | 2.6 | 2.86 | 0.006 | >10$^{11}$ |

Table 2 shows the adding condition, the glossiness and the hardness of the extinction powder in a colored ink layer of Embodiments B1-B12 of the present invention.

TABLE 2

| | Roughness of upper release layer μl | Extinction powder | | | colored ink layer 60° glossiness GU | Hardness |
|---|---|---|---|---|---|---|
| | | Category | Content (wt %) | Average particle diameter μl | | |
| Embodiment B1 | 5.5 | OP935 (phosphorus-based flame retardant) | 10 | 6.1 | 32 | 2H |
| Embodiment B2 | | OP935 (phosphorus-based flame retardant) | 20 | 6.1 | 21 | 2H |
| Embodiment B3 | | ZB467 (phosphorus-based flame retardant) | 10 | 5 | 37 | 2H |
| Embodiment B4 | | ZB467 (phosphorus-based flame retardant) | 20 | 5 | 26 | 2H |
| Embodiment B5 | | ATHG10 (aluminum hydroxide) | 10 | 3 | 59 | 2H |
| Embodiment B6 | | ATHG10 (aluminum hydroxide) | 20 | 3 | 49 | 2H |
| Embodiment B7 | | OP930 (phosphorus-based flame retardant) | 10 | 8.5 | 24 | 2H |
| Embodiment B8 | | OP930 (phosphorus-based flame retardant) | 20 | 8.5 | 14 | 2H |
| Embodiment B9 | | silicon dioxide | 10 | 5.2 | 35 | 3H |
| Embodiment B10 | | silicon dioxide | 20 | 5.2 | 16 | 4H |
| Embodiment B11 | | aluminum oxide | 10 | 5.4 | 48 | 2H |
| Embodiment B12 | | polyimide system | 10 | 8 | 19 | 1H |

As can be seen from Table 2, the corresponding glossiness is obtained by the embodiments of the particle sizes and contents of the added extinction powder, in combination with an upper release layer having the roughness of 5.5 microns. In general, the extinction powder with a large particle size and a large content helps to reduce the glossiness.

Table 3 shows the adding condition, the glossiness and the hardness of the extinction powder in a colored ink layer of Embodiments C1-C15 of the present invention.

TABLE 3

| | Roughness of upper release layer Rz(um) | Extinction powder | | | colored ink layer 60° glossiness (GU) |
|---|---|---|---|---|---|
| | | Category | Content(wt %) | Average particle diameter (um) | |
| Embodiment C1 | 0.5 | OP935 (phosphorus-based flame retardant) | 10 | 3.4 | 82 |
| Embodiment C2 | 2.3 | | | | 70 |
| Embodiment C3 | 6.7 | | | | 6 |
| Embodiment C4 | 0.5 | silicon dioxide | 10 | 5.2 | 75 |
| Embodiment C5 | 2.3 | | 10 | | 65 |
| Embodiment C6 | 6.7 | | 10 | | 4 |
| Embodiment C7 | 0.5 | aluminum oxide | 10 | 5.4 | 74 |
| Embodiment C8 | 2.3 | | 10 | | 66 |
| Embodiment C9 | 6.7 | | 10 | | 5 |
| Embodiment C10 | 0.5 | talcum powder | 10 | 7.8 | 68 |
| Embodiment C11 | 2.3 | | 10 | | 55 |
| Embodiment C12 | 6.7 | | 10 | | 4 |
| Embodiment C13 | 0.5 | polyimide system | 10 | 8 | 60 |
| Embodiment C14 | 2.3 | | 10 | | 40 |
| Embodiment C15 | 6.7 | | 10 | | 3 |
| Comparative example | | colored polyimide film on the market | | | colored polyimide film layer 60° glossiness (GU) 22 |

Note:
The roughness of the upper release layer in Table 2 and Table 3 refers to the roughness of the surface of the upper release layer, in contact with the colored ink layer.

As can be seen from Table 3, the design of the coarsened upper release layer helps to obtain a finished product with lower glossiness. The powder having the average particle diameter can reduce the surface gloss value.

According to the embodiments, the colored ultra-thin high-frequency cover film provided by the invention includes a colored ink layer and a high-frequency bonding agent layer. The upper and lower release layers are attached to the upper and lower portions respectively. The cover film has the low dielectric constant and loss, extremely high ion purity, ultra-thin laminated thickness, high heat dissipation performance, high flame retardancy, and high extinction performance, and is thus particularly suitable for being used in high-frequency high-speed and ultra-fine circuits. The application of the colored ink, especially the black ink, can protect the circuit. The black polyimide which is high in cost and has technical problems can be replaced by using the colored ink and the high-frequency adhesive together.

The above descriptions are only embodiments of the present invention, and are not intended to limit the scope of the present invention. The equivalent structures which are made in view of the specification and the drawing of the invention, or the present invention directly or indirectly applied to other related technical fields, fall into the protection scope of the invention.

What is claimed is:

1. A high-haze colored ultra-thin high-frequency cover film, comprising:
   a colored ink layer and a high-frequency adhesive layer, wherein the colored ink layer is located above the high-frequency adhesive layer, and the colored ink layer comprises at least one layer;
   a hardness of the colored ink layer is HB-5H;
   a glossiness of the colored ink layer ranges from 0 to 60 GU (60°);
   a roughness (Rz) of the colored ink layer is 50-1000 nm;
   a thickness of the colored ink layer is 1-10 microns, and a thickness of the high-frequency adhesive layer is 3-25 microns,
   wherein the high-frequency adhesive layer includes fused silicon dioxide, polytetrafluoroethylene, fluorine-based resin, a phosphorus-based flame retardant, and polyimide-based resin;
   a sum of proportions of the fused silicon dioxide, the polytetrafluoroethylene, the fluorine-based resin and the phosphorus-based flame retardant is 8-50% (by weight) of a total solid content, and a proportion of a polyimide-based resin content is 40%-90% (by weight).

2. The high-haze colored ultra-thin high-frequency cover film according to claim 1, wherein the colored ink layer comprises two layers, and the two layers are respectively a first colored ink layer and a second colored ink layer;
   the first colored ink layer is located on an upper surface of the second colored ink layer, the second colored ink layer is located on an upper surface of the high-frequency adhesive layer;
   a thickness of the first colored ink layer and a thickness of the second colored ink layer are both 2-3 microns.

3. The high-haze colored ultra-thin high-frequency cover film according to claim 1, wherein the colored ultra-thin high-frequency cover film further includes an auxiliary adhesive layer, the auxiliary adhesive layer is located between the colored ink layer and the high-frequency adhesive layer, and a thickness of the auxiliary adhesive layer is 3-25 microns.

4. The high-haze colored ultra-thin high-frequency cover film according to claim 1, wherein the colored ink layer is an ink layer containing extinction powder, and a particle diameter of the extinction powder is 2-12 microns (D90).

5. The high-haze colored ultra-thin high-frequency cover film according to claim 4, wherein the extinction powder in the colored ink layer is at least one of inorganic powder, organic powder, polyimide system and a compound with flame retardancy;
   the inorganic powder is at least one of calcium sulfate, carbon black, silicon dioxide, titanium dioxide, zinc sulfide, zirconium oxide, calcium carbonate, silicon carbide, boron nitride, aluminum oxide, aluminum hydroxide, talcum powder, aluminum nitride, glass powder, quartz powder, emery, and clay;

the compound with the flame retardancy is a flame-retardant compound containing at least one of halogen, phosphorus system, nitrogen, and boron system.

6. The high-haze colored ultra-thin high-frequency cover film according to claim 1, wherein the cover film further includes release layers, and the release layers include an upper release layer and a lower release layer;

the upper release layer is an extinction release film layer, and a surface of the extinction release film layer in contact with the colored ink layer is a rough surface having an Rz value of 0.2-10 microns.

7. The high-haze colored ultra-thin high-frequency cover film according to claim 1, wherein the colored ink layer includes an inorganic pigment or an organic pigment;

wherein, the inorganic pigment is at least one of cadmium red, cadmium lemon yellow, orange cadmium yellow, titanium dioxide, carbon black, black iron oxide and black staggered inorganic pigment, and a sum of a proportion of the inorganic pigment is 5-70% (by weight) of a total solid content of the colored ink layer;

the organic pigment is at least one of aniline black, perylene black, anthraquinone black, benzidine yellow pigment, phthalocyanine blue and phthalocyanine green, and a sum of a proportion of the organic pigment is 5-70% (by weight) of the total solid content of the colored ink layer.

8. A method of preparing the high-haze colored ultra-thin high-frequency cover film of claim 1, comprising:

step 1, coating a colored printing ink raw material on a lower surface of an upper release layer, and curing at a low temperature of 50-180° C. to form the colored ink layer;

step 2, forming the high-frequency adhesive layer on a lower surface of the colored ink layer by a coating method or a transfer printing method;

step 3, attaching a lower release layer to a lower surface of the high-frequency adhesive layer to obtain a finished product.

9. The method of preparing a high-haze colored ultra-thin high-frequency cover film according to claim 8, wherein the colored ink layer includes a first colored ink layer and a second colored ink layer, and the high-frequency adhesive layer is formed on the lower surface of the second colored ink layer.

10. A method of preparing the high-haze colored ultra-thin high-frequency cover film of claim 1, comprising:

step 1, coating a colored printing ink raw material on a lower surface of an upper release layer, and curing at a low temperature of 50-180° C. to form the colored ink layer;

step 2, coating an auxiliary adhesive layer on a surface of the colored ink layer;

step 3, forming the high-frequency adhesive layer on a lower surface of the auxiliary adhesive layer by a coating method or a transfer printing method;

step 4, attaching a lower release layer to a lower surface of the high-frequency adhesive layer to obtain a finished product.

* * * * *